(12) United States Patent
Moore

(10) Patent No.: US 11,588,488 B1
(45) Date of Patent: Feb. 21, 2023

(54) DUAL-LOOP PHASE-LOCKING CIRCUIT

(71) Applicant: Raytheon Company, Waltham, MA (US)

(72) Inventor: Gary Ian Moore, Fremantle (AU)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/546,662

(22) Filed: Dec. 9, 2021

(51) Int. Cl.
*H03L 7/087* (2006.01)
*H03L 7/093* (2006.01)
(Continued)

(52) U.S. Cl.
CPC .............. *H03L 7/087* (2013.01); *H03L 7/093* (2013.01); *H03L 7/095* (2013.01); *H03L 7/0995* (2013.01); *H03L 7/23* (2013.01)

(58) Field of Classification Search
CPC . H03L 7/08; H03L 7/085; H03L 7/087; H03L 7/093; H03L 7/095; H03L 7/10;
(Continued)

(56) References Cited

U.S. PATENT DOCUMENTS 3,815,042 A * 6/1974 Maunsell ................ H03L 7/087
331/11
4,635,000 A * 1/1987 Swanberg ............... H03L 7/089
331/25

(Continued)

FOREIGN PATENT DOCUMENTS

DE  102017117900 A1 * 2/2019  ............. H03L 7/087
WO  WO-9301657 A1  1/1993

OTHER PUBLICATIONS

"Phase Noise Measurement Solutions Finding the Best Fit for Your Test Requirement—Selection Guide", Keysight Technologies, (2018), 24 pgs.

(Continued)

*Primary Examiner* — Levi Gannon
(74) *Attorney, Agent, or Firm* — Schwegman Lundberg & Woessner, P.A.

(57) ABSTRACT

A dual-loop phase-locking circuit combines a conventional phase-frequency-detector (PFD) and frequency-divider based first loop to lock an output signal frequency to a multiple of a reference signal frequency within a first loop bandwidth BW1 with a second loop to simultaneously lock the output signal phase to a second signal independently locked to the same multiple of the reference signal. The second loop integrates the phase error between the output signal and the second signal, and applies an offset at the PFD output in the first loop to reduce the first loop phase errors within a second loop bandwidth BW2 (<BW1). The first loop bandwidth BW1 can be optimized for overall phase-noise performance of the output signal while retaining the excellent capture and hold characteristics of that loop's topology. The second loop provides superior carrier-frequency phase alignment between the output signal and second signal. The output and second signal may therefore be configured as inputs to systems that require highly coherent carrier signals with de-correlated phase-noise such as phase-noise measurement systems or phase-noise cancellation systems.

20 Claims, 10 Drawing Sheets

(51) Int. Cl.
*H03L 7/095* (2006.01)
*H03L 7/23* (2006.01)
*H03L 7/099* (2006.01)

(58) Field of Classification Search
CPC ..... H03L 7/107; H03L 7/1075; H03L 7/1077; H03L 7/22; H03L 7/23; H03L 7/235; H03L 2207/10; H03L 2207/12
See application file for complete search history.

(56) References Cited

U.S. PATENT DOCUMENTS

| | | | |
|---|---|---|---|
| 5,142,246 A | | 8/1992 | Petersson |
| 5,146,186 A | * | 9/1992 | Vella .................. H03L 7/23 331/11 |
| 6,297,702 B1 | | 10/2001 | Locker et al. |
| 6,801,592 B1 | * | 10/2004 | Christensen ......... H04L 7/0037 327/147 |
| 6,900,676 B1 | * | 5/2005 | Tamura ................ H03L 7/087 327/147 |
| 6,990,164 B2 | | 1/2006 | Bushman et al. |
| 7,323,942 B2 | | 1/2008 | Ishizaka et al. |
| 7,554,412 B2 | * | 6/2009 | Kojima ................ H03L 7/087 331/11 |
| 8,537,952 B1 | * | 9/2013 | Arora .................. H03L 7/1974 375/376 |
| 9,444,470 B2 | * | 9/2016 | Milijevic ............. H03L 7/087 |
| 2007/0274425 A1 | * | 11/2007 | Werker ................ H03L 7/091 375/376 |

OTHER PUBLICATIONS

Barrett, Curtis, "Fractional/Integer-N PLL Basics", Texas Instruments Technical Brief SWRA029, Wireless Communication Business Unit, (Aug. 1999), 1-55.

Ferrand, Paul, "Mixing Oscillators for Phase Noise Reduction", IEEE Sig Proc Letters, vol. 23, No. 11, (Nov. 2016), 1597-1601.

Goel, Ankush, et al., "Concurrent Dual-Frequency Oscillators and Phase-Locked Loops", IEEE Trans. on Microwave Theory and Techniques, vol. 56, No. 8, (Aug. 2008), 1846-1860.

Woo, Youngshin, et al., "Phase-locked loop with dual phase frequency detectors for high-frequency operation and fast acquisition", Microelectronics Journal 33, (2002), 245-252.

* cited by examiner

DUAL-LOOP PHASE-LOCKING CIRCUIT

BACKGROUND OF THE INVENTION

Field of the Invention

This invention relates to Phase-Locked Loops (PLLs) for oscillator phase control and more particularly to their use in dual-output signal sources that are frequency locked to a common reference and phase-locked to each other at a common carrier frequency.

Description of the Related Art

Some signal sources utilize an oscillator that is phase locked to a reference signal. Typically, sources using oscillators operating in the multi-gigahertz range or S, C and X frequency bands are frequency or phase locked to lower frequency references such as 10 MHz signals supplied by high stability crystal oscillators. It is also common to arrange for oscillators of the same nominal frequency to be phase locked.

Generally the output of an oscillator is considered as the sum of a carrier signal and noise sidebands characterized by an offset frequency from the carrier. It is an inherent property of phase-locking circuits that they reduce the difference between the phase noise of the two locked oscillators at low offset frequencies. In other words the carriers and low-frequency-offset phase noise become highly correlated.

One application for phase-locked dual-output signal sources is in measuring phase noise to characterize the oscillator performance. Another is in radar systems. In both these applications it can be desirable to maintain the uncorrelated nature of the oscillator phase noise to as low an offset frequency (as close to the carrier) as possible. In phase noise measurement systems this decreases the need to apply corrections for the action of the phase locking circuitry. In radar systems the uncorrelated nature of the noise allows an improvement in carrier-to-noise ratio by taking advantage of the nature of random addition of the noise side-bands when the carriers are added coherently.

The process of locking an oscillator to a reference is well known and utilizes a Phase-Locked Loop (PLL). There are a number of different PLL configurations to choose from but for the purposes of discussion a basic configuration of a PLL utilizing a mixer phase detector is shown in FIG. 1. As shown, a signal source 10 with phase-locked dual outputs 12 and 14 includes a reference signal 16 at a reference frequency fref that forms output 12 and a PLL 18 that generates output 14 that is both frequency and phase-locked to reference signal 16, hence output 12.

PLL 18 includes an oscillator 20 that is configured to operate at nominally the same frequency fref as the reference signal, a phase detector 22 (e.g. a mixer) that compares the phase of output 12 to the output phase of the oscillator (also the phase of output 14) and generates a phase error signal 24, and a loop filter 25 that integrates the phase error signal 24 with an effective loop bandwidth BW to produce a tuning signal 26 to tune oscillator 20 to control the oscillator frequency over a "tuning range". The effective loop bandwidth BW is based on the combined properties of phase detector 22, loop filter 25 and the tuning of oscillator 20.

As shown in FIG. 2, assuming an integrating loop filter or "Type II" PLL, a phase error response 30 representing the phase noise sidebands is reduced at frequencies lower than the loop bandwidth BW 32 at 40 dB/decade as the side-band frequency approaches zero. An alternative description of the PLL behavior is that the phase error at the phase detector is reduced at lower offset frequencies from the carrier with the phase-noise sidebands become increasing correlated at lower frequencies within the PLL loop BW 32. Outside the PLL loop bandwidth 32 the phase-noise sidebands remain un-correlated.

The principal consideration in this PLL arrangement would be selecting the loop bandwidth BW of the PLL. In previously mentioned applications, a narrow loop bandwidth is desirable to allow measurement, or partial cancellation, of noise sidebands over the greatest possible range of frequencies, while a wide loop bandwidth allows the PLL to capture and hold lock in the face of external disturbances (e.g. thermal fluctuations, vibration or shock etc.) to the oscillator's frequency. The PLL's capture range is largely determined by the loop bandwidth BW. Thus, selection of the PLL bandwidth is a compromise or trade off between capture/hold and noise performance.

"Capture Range" refers to the fact that the PLL can only achieve phase lock if the difference between the frequency of the oscillator and the reference signal is small enough. In practice this is ultimately limited by the tuning range of the oscillator but in the PLL of FIG. 1 it is also limited by the loop bandwidth BW 32.

To understand this, suppose the two oscillators are at different frequencies. The phase difference between the two oscillators increases linearly in time. However, the phase detector measures the phase difference modulo $2\pi$, so the output of the phase detector will oscillate at the difference frequency. If the frequency of the oscillating phase error signal is outside the loop bandwidth BW 32, than FIG. 2 suggests that the PLL will be unable to reduce the phase error and the oscillators remain as they are—unlocked. In practice the capture range extends some way beyond the loop bandwidth but it is a reasonable simplification to equate the bandwidth and capture range in FIG. 1.

Often high frequency oscillators are phase-locked to a lower frequency reference signal to produce a high frequency signal source having the combined stability of the reference and lower phase-noise of the oscillator. Commonly 10 MHz is used as a reference frequency. Very stable references exist at this frequency. The high frequency oscillator will typically reside in the multi-gigahertz range. Because of the very large difference between the oscillator and reference frequencies, the circuit of FIG. 1 is not applicable.

As shown in FIG. 3, in an embodiment a reference-locked signal source 40 includes a low frequency reference signal 42 at frequency fref and a Type II PLL 44 that generates an output signal 46 at an output frequency N*fref where N is an integer (e.g. 512, 1024, etc.). Type II PLL 44 includes an oscillator 48 that is configured to operate at nominally the desired output frequency, a divide-by-N circuit 50 that scales the output frequency by 1/N, a phase detector 52 (e.g. a Phase-Frequency-Detector (PFD)) that compares the reference phase to the output phase of the divide-by-N circuit and generates a phase error signal 54, and a loop filter 56 that integrates the phase error signal 54 with an effective loop bandwidth BW to produce a tuning signal 58 to tune oscillator 48 to control the oscillator frequency over the tuning range.

Generally, the characteristics of the reference-locked signal source 40 are like that of the signal source 10 of FIG. 1 except that any phase variation at the output on the right is N times what it is at the PFD 52; a phase fluctuation of 1° in the 10 MHz reference (at a frequency inside the PLL loop bandwidth) results in a N° fluctuation at the high frequency output. For example, for N=1,000, the fluctuation could be 1,000°.

One of the advantages of the reference-locked signal source 40 is that it has a capture range that is essentially the same as the tuning range of the oscillator, independent of the PLL loop bandwidth. This is principally because the PFD provides a linear output over the full 360° of phase error and can cause the output of the loop filter to rapidly slew over the entire tuning range. However, PFDs often include special circuitry to improve capture, for example holding the PFD output in saturation when the phase error is larger than 360°; such techniques are well established in the art and are taken as options covered by the general PFD term used herein.

The challenge is to design a phase lock loop (PLL) circuit that provides dual high-frequency signals that are robustly frequency-locked to a low frequency reference, fref, and phase locked to each other at the common carrier frequency (N*fref). In particular, it is an aim to achieve a PLL capture and hold range that spans the tuning range of the oscillator in combination with a loop bandwidth that is sufficiently narrow that the side-band noise of interest is largely uncorrelated while also maintaining sufficient carrier phase alignment.

One approach as shown in FIG. 4 is dual reference-locked signal sources 60, 62 in which a pair of reference-locked signal sources of the type shown in FIG. 3 are independently locked to the same low frequency reference signal 64 at frequency fref to generate output signals 66 and 68 at a carrier frequency N*fref. The output signals are frequency-locked to the reference signal and, as a consequence, to each other. In each individual source, the loop bandwidth can be selected while retaining the full capture range. Since each output signal is "phase-locked" to the reference signal one might assume that the output signals would be "phase-locked" to each other. This would be incorrect. The PLL within each source does reduce the phase error to a very small level at the PFD. However, the phase error is amplified at the output signals by a factor of N. It is common to see the phase error at the output change by hundreds of degrees in response to say temperature changes, which makes this architecture useless for phase noise measurement and noise cancellation systems.

As shown in FIG. 5, another approach is a reference-locked signal source 70 with dual phase-locked outputs that includes a reference-locked signal source 72 (of the type shown in FIG. 3) that generates a first high frequency output signal 74 at frequency N*fref (e.g. 10 GHz) that is locked to a low frequency reference signal at fref (e.g. 10 MHz) and a PLL 76 (of the type shown in FIG. 1) that generates a second high frequency output signal 78 at the same frequency and phase (within specified tolerances).

The problem with this architecture is that the capture range of PLL 76 depends upon its loop bandwidth. Thus, reference-locked signal source 70 is subject to the same compromise or tradeoff in choosing the loop bandwidth of PLL 76 with a wider bandwidth being preferable for capture/hold and a narrower bandwidth being preferable for noise decorrelation. Typically, the loop bandwidth of PLL 76 will be at least an order of magnitude greater than the loop bandwidth of the reference-locked signal source 72.

A simple example to illustrate the problem. The oscillator in PLL 76 may be approximately 10 GHz with a tuning range of 2,000 Hz. To ensure capture the loop bandwidth should be close to 2,000 Hz. However, to provide adequate noise decorrelation one would prefer a loop bandwidth less than 200 Hz and preferably closer to 10 Hz. If the loop bandwidth is designed to be near 2,000 Hz, the source will capture effectively and be stable but will not be effective for either phase noise measurement or noise cancellation systems. If the loop bandwidth is much narrower, the noise properties may be sufficient for these applications but the source may never capture lock, or may lose lock easily under the influence of external disturbances or may not reduce the phase error between the output carriers sufficiently.

One approach to addressing this compromise is to switch different loop filters in the PLL 76. A wide bandwidth filter that allows the maximum capture range equal to the oscillator tuning range can be used initially (or after a disturbance causes loss of lock) to enforce capture. A narrow bandwidth filter can be used once lock is established. The downside is that the source is susceptible to loss of lock with the narrow bandwidth filter in place. Loss of functionality while lock is recaptured is highly undesirable in most applications.

Another approach is to use dual reference-locked signal sources 60 (as shown in FIG. 4) to initially bring output signals 74 and 78 into frequency-lock and then use an arrangement of switches to reconfigure to the reference-locked signal source 70 shown in FIG. 5. However, while in the FIG. 4 configuration, second output signal 78 is held at the same frequency as first output signal 74 only because the lower PLL 76 is applying a tuning signal to the tuning port of the lower oscillator. To reconfigure into the circuit of FIG. 5, the lower PLL 76 must be disconnected, and as soon as that happens the frequency of the lower oscillator reverts to its "free-running" value. If that free-running value is outside the capture range of the PLL 76 controlling second output signal 78 in FIG. 5, then the oscillators will not become phase locked. Usually, some other frequency control mechanism, such as thermal adjustment, must be used to force the tuning voltage to a "neutral" value before the switch is made.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a dual-loop phase-locking circuit that combines a conventional phase-frequency-detector (PFD) and frequency-divider based first loop (e.g. a Type II PLL) to lock an output signal frequency to a multiple of a reference signal frequency within a first loop bandwidth BW1 with a second loop to simultaneously lock the output signal phase to a second signal independently locked to the same multiple of the reference signal. The second loop integrates the phase error between the output signal and the second signal, and applies an offset at the PFD output in the first loop to reduce the first loop phase errors within a second loop bandwidth BW2 (<BW1). The first loop bandwidth BW1 can be optimized for overall phase-noise performance of the output signal while retaining the excellent capture and hold characteristics of that loop's topology. The second loop provides superior carrier-frequency phase alignment between the output signal and second signal. The output and second signal may therefore be configured as inputs to systems that require highly coherent carrier signals with de-correlated phase-noise such as phase-noise measurement systems or phase-noise cancellation systems.

In an embodiment, a dual-loop phase-locking circuit includes a first input configured to receive a first reference signal at a first reference frequency fref1 having a first reference phase and a second input configured to receive a second reference signal at a second reference frequency fref2 that is independently locked to a multiple N of the reference signal and having a second reference phase. A PLL is coupled to the first input. The PLL includes a first phase detector (e.g. a phase-frequency detector (PFD), a divide-by-N circuit, a first integrating filter and an oscillator connected to provide a first loop with a first loop bandwidth BW1 to generate an output signal having an output frequency independently locked to the same multiple N of the reference signal and having an output phase. The PLL is configured to include a second loop coupled to the second input. The second loop includes a second phase detector (e.g. a mixer) configured to compare the output phase to the second reference phase to generate a phase error signal and a second integrating filter configured to integrate the phase error signal to produce an offset signal that is added to an input of the first integrating filter in the first loop to reduce fluctuations in the phase error signal having frequencies less than a second loop bandwidth BW2<BW1 (and preferably BW2<1/10*BW1).

In an embodiment, because the capture range is decoupled from the loop bandwidth in the PLL, the dual-channel phase-locking circuit can be configured such that the capture range spans the tuning range of the oscillator while the loop bandwidths BW1 and BW2 are less, preferably significantly less, than the tuning range of the oscillator. In certain embodiments, BW2<1/10*BW1<1/10* tuning range. For example, a 10 GHz oscillator may have a tuning range of approximately 2,000 Hz. The capture range would span 2,000 Hz. The first loop bandwidth might be 10-20 Hz while the second loop bandwidth is less than 1 Hz.

In different embodiments, the second loop may be implemented either with analog or digital technology. If digital, an A/D converter converts the phase error signal to a digital signal, a digital filter implements the second integrating filter to integrate the digital signal and a D/A converter that generates an analog signal produces the offset signal. In some embodiments the offset signal will be a variable current source that can be summed directly with the output of common PFD circuits.

In an embodiment, in either analog or digital implementations, to prevent saturation of the second integrating filter during initial capture by the first loop, the output of the second integrating filter is held at zero until the first loop achieves a phase-locked state (e.g. the output of the first phase detector lies within a phase window).

In an embodiment, the second reference frequency is N*fref1/M. The dual-loop phase-locking circuit further includes a divide-by-M circuit coupled to the output of the oscillator to scale the output frequency to N*fref1/M. The second phase detector compares the output phase at the output of the divide-by-M circuit to the second reference phase to generate the phase error signal. This may be done, for example, when high quality oscillators are available at N*fref1.

In an embodiment, the second loop is configured to add a set-point to the phase error signal at the input to the second integrating filter to specify a phase offset between output signal and the second reference signal. In another embodiment, the second phase detector includes an I/Q mixer that generates "I" and "Q" outputs in which the "I" output responds to the phase error and the "Q" output responds to the phase error plus 90 degrees so that together the outputs uniquely identify any phase angle between 0 and 360 degrees. This can be implemented for either analog or digital implementations of the second loop.

In an embodiment, the output signal and second reference signal have a common frequency independently locked to a multiple of the first reference signal and are phase-locked to each other at that frequency to form a dual-output signal source. In different embodiments, a signal source is independently locked to the reference signal to produce the second reference signal at the second input. This signal source may or may not be a PLL. If a PLL, then it may be of the type based upon a PFD and divide-by-N loop as already shown or a type using a sampling phase detector (SPD) that does not require the use of a divide-by-N.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a dual-loop phase-locking circuit that combines a conventional phase-frequency-detector (PFD) and frequency-divider based first loop to lock an output signal frequency to a multiple of a reference signal frequency within a first loop bandwidth BW1 with a second loop to simultaneously lock the output signal phase to a second signal independently locked to the same multiple of the reference signal. The second loop integrates the phase error between the output signal and the second signal, and applies an offset at the PFD output in the first loop to reduce the first loop phase errors within a second loop bandwidth BW2 (<BW1). The first loop bandwidth BW 1 can be optimized for overall phase-noise performance of the output signal while retaining the excellent capture and hold characteristics of that loop's topology. The second loop provides superior carrier-frequency phase alignment between the output signal and second signal. The output and second signal may therefore be configured as inputs to systems that require highly coherent carrier signals with de-correlated phase-noise such as phase-noise measurement systems or phase-noise cancellation systems.

Figure 6:
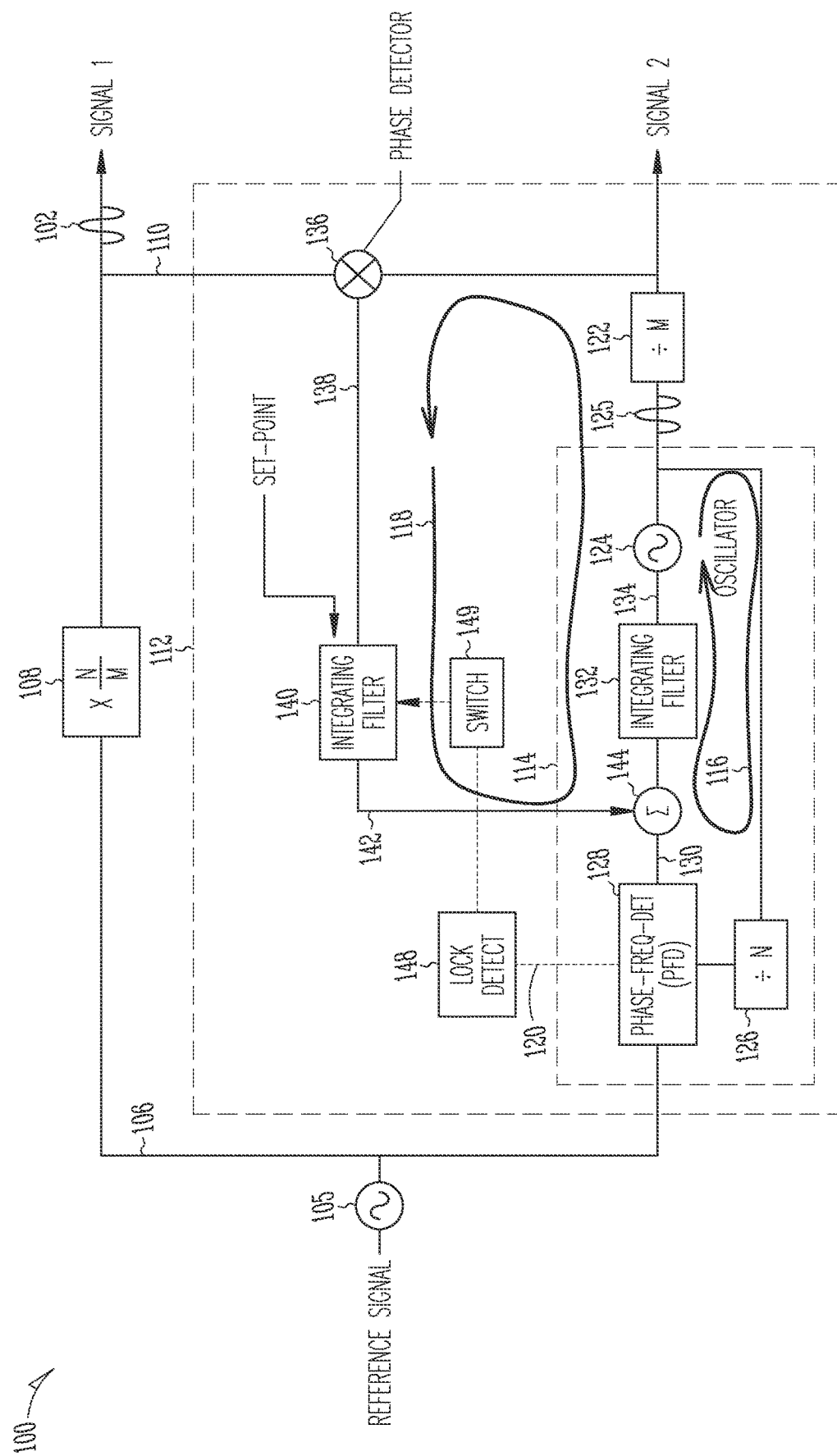
FIG. 6 is an embodiment of a dual-output signal source with reference and phase-locked outputs.

Referring now to FIG. 6, an embodiment of a dual-output signal source 100 generates reference and phase-locked output signals 1 102 and 2 104. Signal source 100 includes a reference signal 105 at a reference frequency fref having a reference phase that is provided at a first input 106, a circuit 108 coupled to reference signal 105 and configured to generate output signal 1 102 having a first output frequency f1 that is locked to a multiple N/M of the reference signal where N and M are integers with N>100, N>M and N/M is also an integer, having a first output phase provided at a second input 110 and a dual-loop phase-locking circuit 112 coupled to the first and second inputs 106 and 110, respectively, to generate output signal 2 104 that is independently locked to the same multiple N of the reference signal and divided by M such that the first and second output signals 102, 104 have a common carrier frequency N×fref/M controlled by and independently locked to the reference signal 105 and are phase-locked to each other at the carrier frequency N*fref/M.

Reference signal 105 can be provided by any suitable source including but not limited to a crystal oscillator. In certain applications, for example, 10 MHz sources will exist that produce a very precise and stable 10 MHz reference signal that is acceptable.

Figure 1:
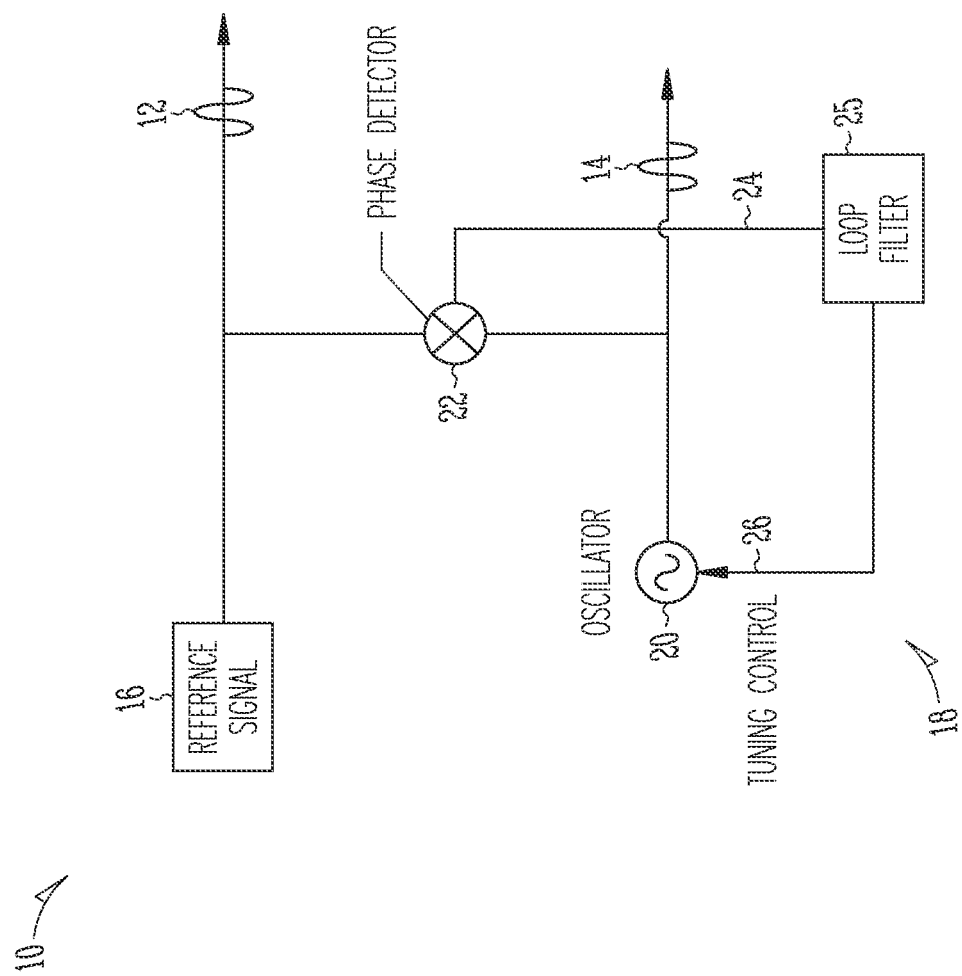
FIG. 1, as described above, is an embodiment of a signal source with phase-locked dual outputs.
Figure 2:
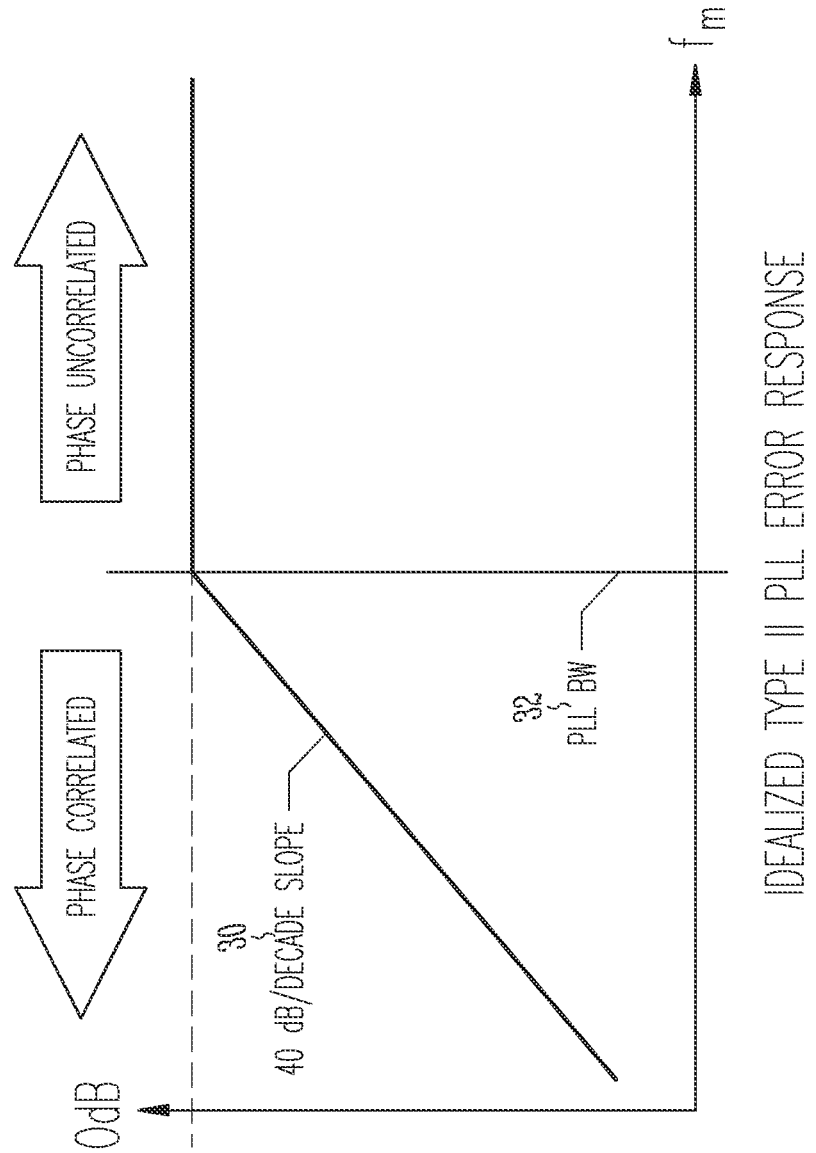
FIG. 2, as described above, is a plot of phase error response for an idealized Type II PLL.
Figure 3:
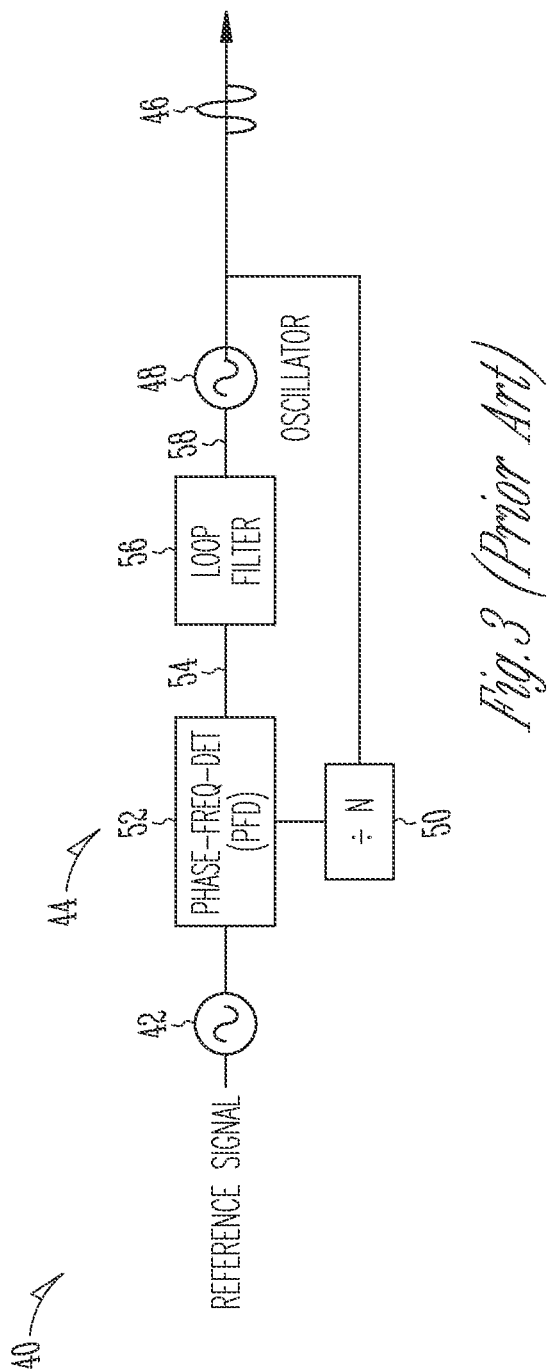
FIG. 3, as described above, is an embodiment, of a reference-locked signal source using a PFD-based PLL.

Circuit 108 can be any suitable circuit that produces an output signal 1 102 at a frequency N*fref/M with a first output phase that is locked to reference signal 105. For example, the circuit may be a PLL of the type depicted in FIG. 3 with a divide-by-M circuit at the output or may be a PLL including a sampling phase detector (SPD). If the circuit is a PLL, its loop bandwidth is suitably the same or slightly wider than the PLL in the dual-loop phase locking circuit. The circuit does not have to be a simple PLL and may generate the output 102 through any suitable manner of synthesis available in the art.

Dual-loop phase-locking circuit 112 includes a PLL 114 that defines a first loop 116 having a first loop bandwidth BW1 that controls an oscillator 124 to generate an intermediate signal 125 at intermediate frequency fn=N*fref (e.g. N=1,000, approximately 10 GHz for a 10 MHz reference signal) and a divide-by-M circuit 122 to generate output signal 104 at the common carrier frequency N*fref/M that is independently locked to reference signal 105, a second loop 118 that measures and integrates the phase error between output signals 102, 104 and applies an offset signal into the first loop 116 to reduce the phase errors within a second loop bandwidth BW2, and an optional control path 120 that enables the second loop 118 once the first loop 116 has locked the output frequency. If M=1, the divide-by-M circuit 122 can be omitted in which case the intermediate signal 125 at N*fref becomes output signal 104.

PLL 114 includes oscillator 124 that is configured to operate at nominally the intermediate output frequency fn, a divide-by-N circuit 126 that scales the intermediate frequency fn by 1/N, a phase detector 128 (e.g. a Phase-Frequency-Detector (PFD)) that compares the reference phase to the output phase of the divide-by-N circuit and generates a phase error signal 130, and an integrating filter 132 that integrates the phase error signal 130 with the first loop bandwidth BW1 to produce a tuning signal 134 to tune oscillator 124 to control the oscillator frequency and drive it to N*fref. The topology of the PLL decouples the capture range from the first loop bandwidth BW1. The first loop bandwidth BW1 can be optimized for overall phase-noise performance of the output signal while retaining the excellent capture and hold characteristics of that loop's topology.

The divide-by-M circuit 122 at the output of the oscillator 124 is configured to reduce the intermediate frequency fn to the second output frequency f driven to equal N×fref/M and having a second output phase. This is common, for example, in radar systems where a high frequency oscillator is divided down to produce various system clocks. The dual-loop phase-locking circuit can be extended to the case where the phase alignment is desired at the output of the divide-by-M stages, thereby allowing coherent-carrier-addition noise cancellation to be applied to noise in the divider chains. Since dividers usually start with an ambiguous phase relationship between input and output, the PLL may need to adjust the phase of the oscillator by several multiples of 360° to achieve initial phase alignment of the signals after division by M. However, the phase change at the oscillator output is reduced by a factor of N at the PFD; for example, a phase change of four complete 3600 cycles, 1440°, requires a phase shift of 1440/N° at the PFD or a change of order 10 or 2° for typical values of N used in such systems.

The second loop 118 includes a second phase detector (e.g. a mixer) 136 configured to compare the output phases of output signals 1 and 2 102 and 104 to generate a phase error signal 138 and a second integrating filter 140 configured to integrate the phase error signal 138 to produce an offset signal 142 that is summed at summing circuit 144 with phase error signal 130 at the input of the first integrating filter 136 in the first loop 136 to reduce fluctuations in the phase error signal having frequencies less than a second loop bandwidth BW2<BW1. In the same manner, any phase drift in the PFD or the divide-by-N circuit appears to the second loop as a phase error in the oscillator output and within the second loop bandwidth BW2 the effect of such errors are reduced.

Because the second loop 118 contains both integrating filters 132 and 140 in series, its loop bandwidth BW2 is necessarily narrower then the first loop bandwidth BW1. Furthermore, it is generally desirable to make the second loop bandwidth BW2 significantly lower, often by at least a factor of 10, than the first loop bandwidth BW1. Since the time constant of the second integrating filter 140 may be very long, an aspect of a practical implementation is to hold the second integrating filter output at zero until such time as the first loop 118 has achieved its phase-locked state. This avoids any need to consider the consequences of, and recovery from, possible saturation of the second integrating filter 140 prior to or during initial capture of lock in the first loop. It is a simple matter to arrange a lock detection circuit 148 and either an analog or digital switch 149 in control path 120 that holds the second integrating filter 140 output at zero until such time as the PFD output remains within a predetermined phase window as detected by lock detection circuit 148. However, such a configuration is optional provided the offset signal 142, corresponding to saturation of the second loop filter, amounts to less than 180° of phase offset in loop 1, something that often follows naturally as a consequence of requiring BW2<1/10*BW1.

The second loop provides superior carrier-frequency phase alignment between the output signal and second signal. The output and second signal may therefore be configured as inputs to systems that require highly coherent carrier signals with de-correlated phase-noise such as phase-noise measurement systems or phase-noise cancellation systems.

It will be understood that in the circuit, the oscillator output is held in quadrature since the mixer will have nominally zero output at either 90° or 2700 phase difference; the loop will only lock at one of these angles depending on the sign of the gain around the loop, but that is incidental to the discussion. Any phase relationship can be established by adding an adjustable phase shifter after the circuit. Alternately, a phase relationship (over a limited range) can be established by summing a set-point 146 with phase error signal 138 at the input to second integrating filter 140.

Figure 7:
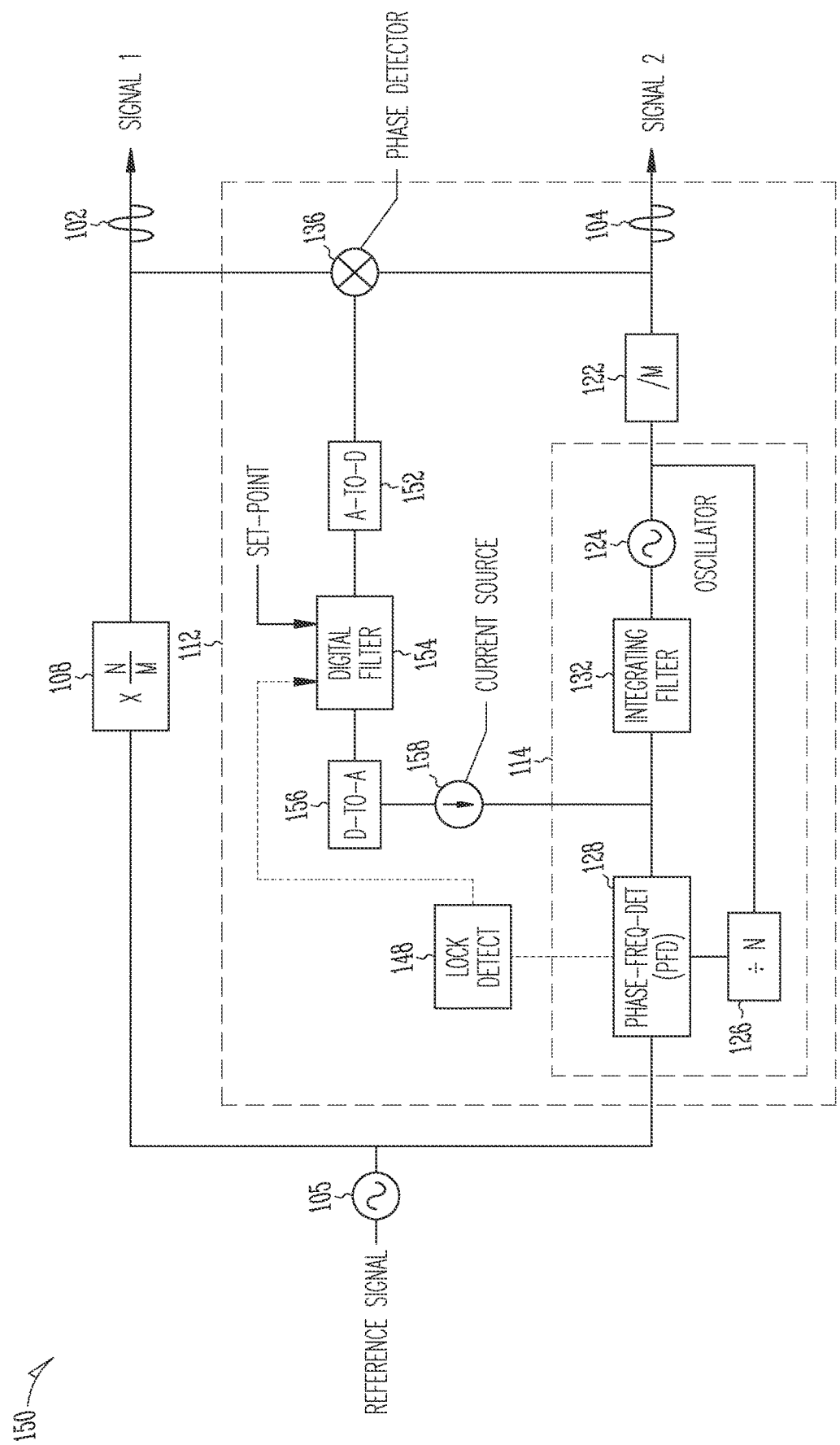
FIG. 7 is an embodiment of a dual-output signal source with reference and phase-locked outputs in which the integrating filter in the second loop is implemented digitally.

Referring now to FIG. 7, in an embodiment of a dual-output signal source 150 the second loop 118 is implemented digitally by using an analog-to-digital converter 152 to sample the phase detector, a digital filter 154 to apply digital filtering techniques to the sampled values to integrate the phase error signal 138, a D/A converter 156 to convert the digital signal to an analog signal to drive a variable current source 158 to produce offset signal 142 that can be summed directly with the output of PFD 128 to drive integrating filter 134. For conciseness, like elements retain the same reference numbers as signal source 100 in FIG. 6. Note, in the digital implementation switch 149 is implemented as a software switch in digital filter 154.

Figure 8:
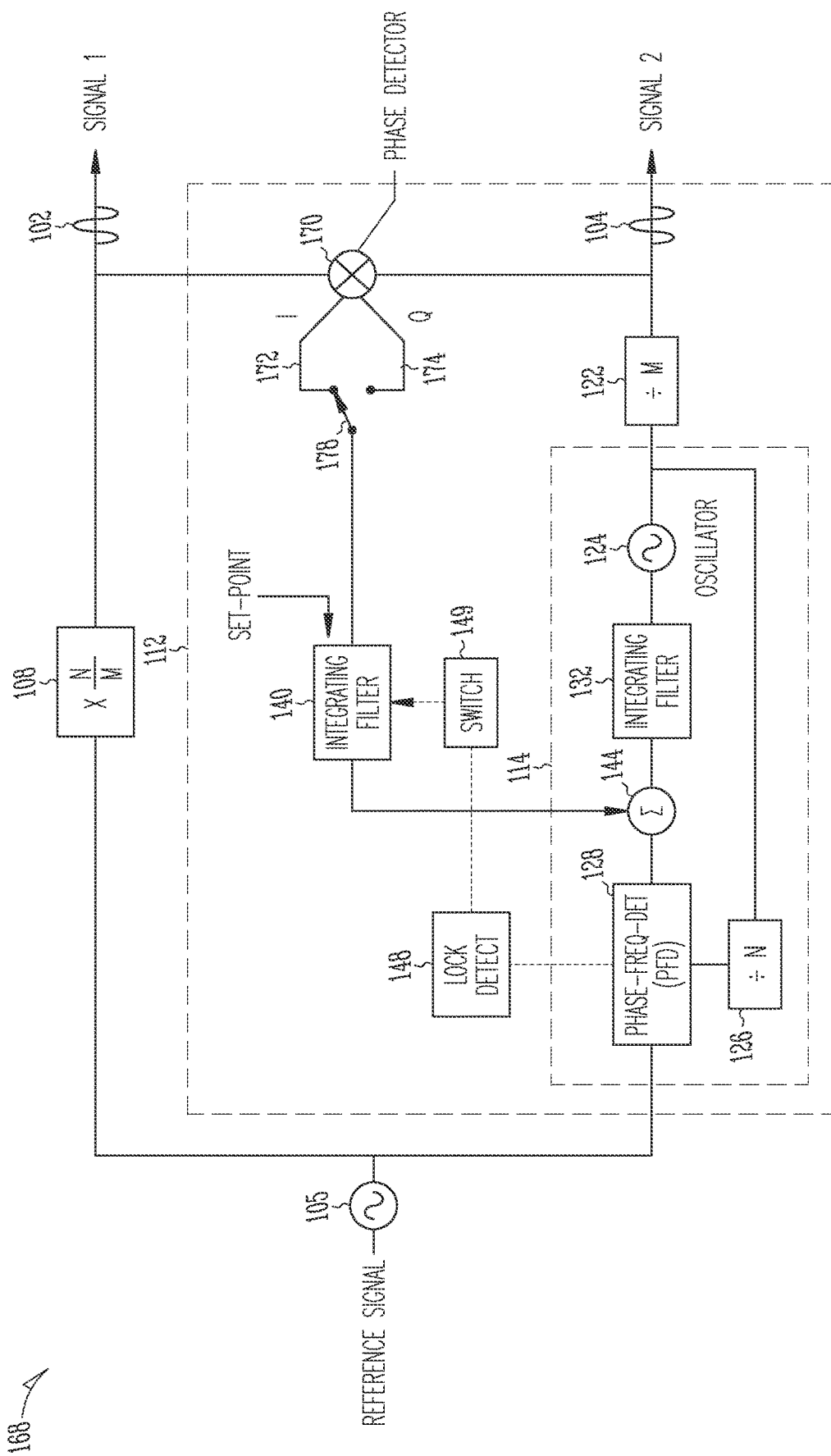
FIG. 8 is another embodiment of a dual-output signal source with reference and phase-locked outputs that allows the phase relationship between the output signals to be set over a range of 360 degrees.

Referring now to FIG. 8, a modification of second loop 118 shown in FIG. 6 allows the phase relationship between Signals 1 and 2 in a dual-output signal source 168 to be adjusted to any desired value. For conciseness, like elements in signal source 168 retain the same reference numbers as signal source 100 in FIG. 6. Phase detector (mixer) 136 is replaced with an IQ mixer 170, which is simply two mixers in which one of the mixers has an additional 90° of phase shift added to one of its inputs. The two outputs, "I" 172 and "Q" 174, together uniquely identify any phase angle between 0° and 360°; one or both being sensitive at any specific phase angle. By introducing a set-point offset at the input to integrating filter 140, selecting whichever one of the "I" or "Q" outputs is appropriate for that set-point via switch 178, and choosing a sign applied within the second integrating filter 140 via an analog or digital switch; all of which are easily done within the aforementioned analog or digital implementations, it is possible to steer the phase difference at the output signals to any desired value between 0° and 360°, overcoming any start-up phase ambiguity in the divider chains and removing any need for a subsequent phase shifter to achieve a specific phase alignment.

Figure 4:
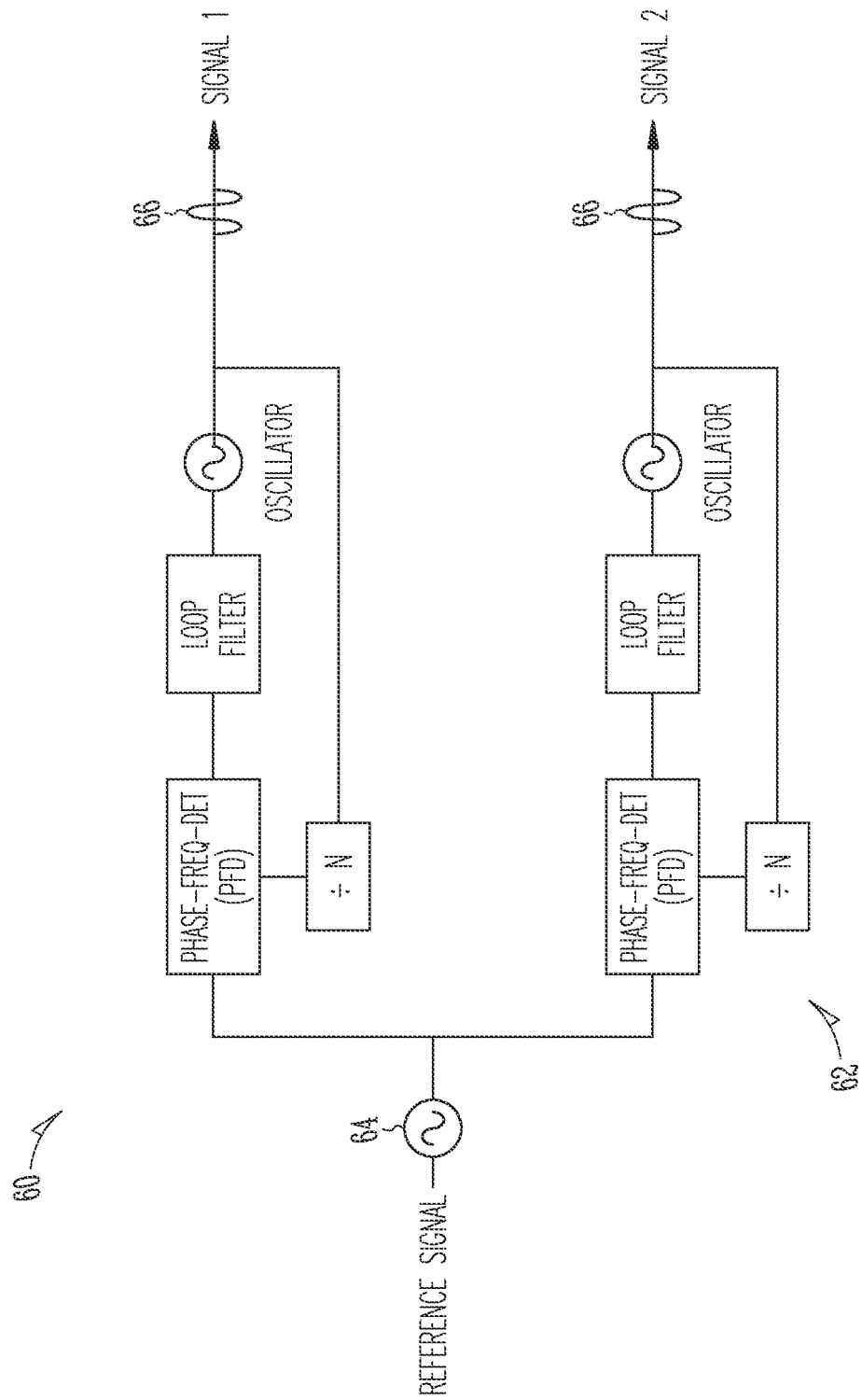
FIG. 4, as described above, is an embodiment of a dual reference-locked signal sources.
Figure 5:
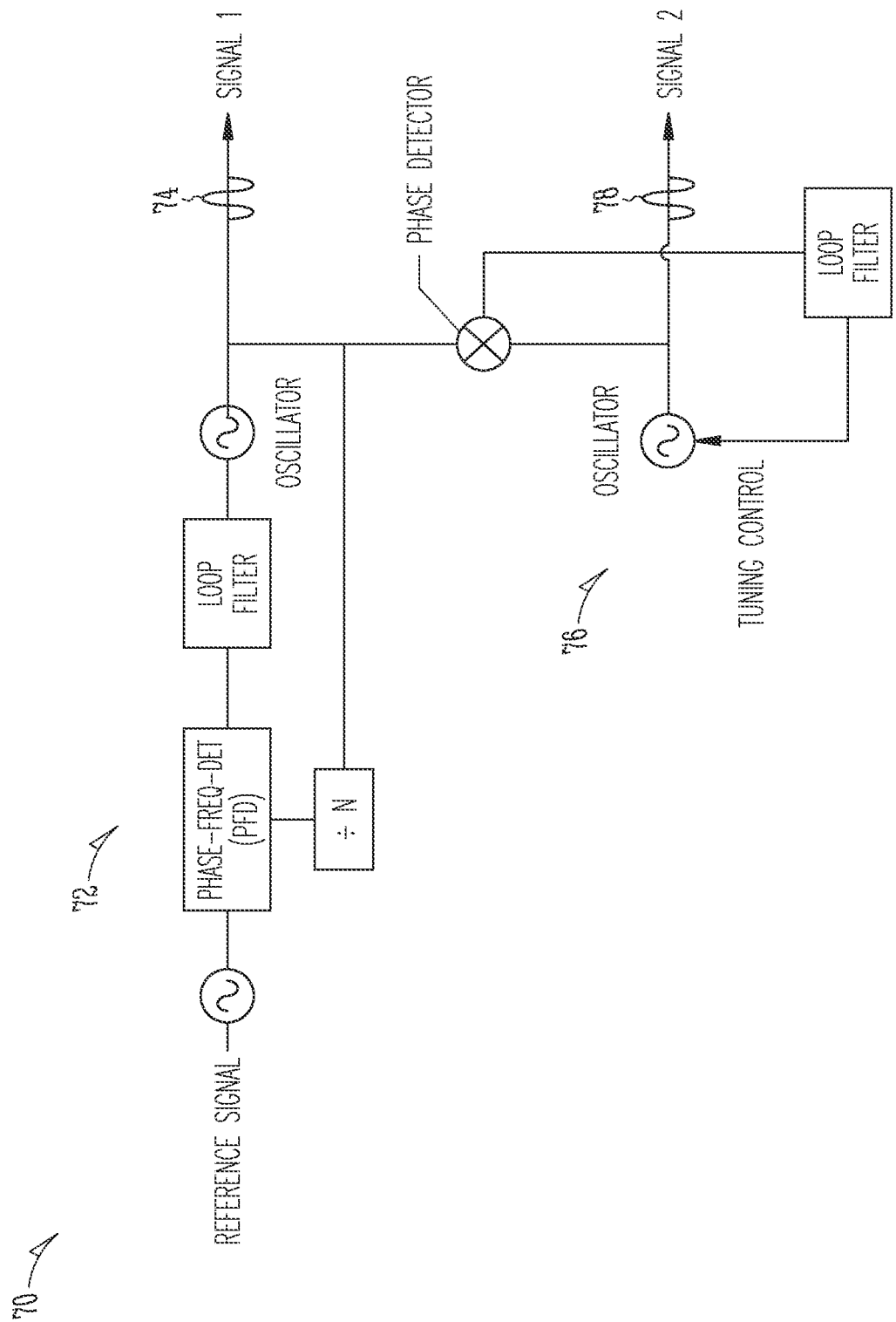
FIG. 5, as described above, is an embodiment of a reference-locked signal source with dual phase-locked outputs.
Figure 9:
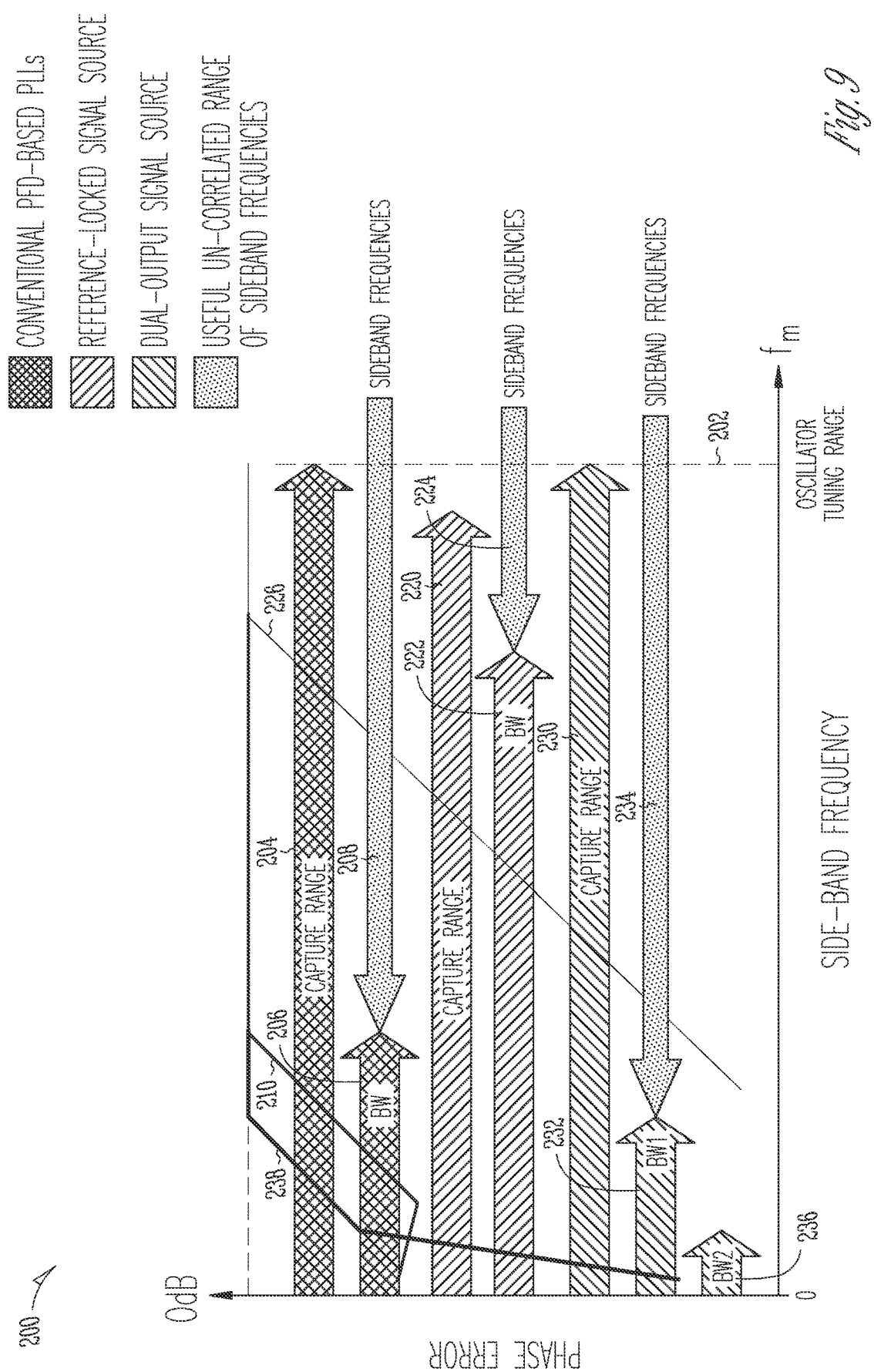
FIG. 9 is a diagram comparing the capture and loop bandwidths, noise decorrelation bandwidths and phase error response of the dual PLLs of FIG. 4, the reference-locked signal source of FIG. 5 and the dual-output signal source of FIG. 6.

Referring now to FIG. 9, a diagram 200 compares the capture bandwidths, useful un-correlated range of sideband frequencies, and phase error between output signals 1 and 2 over a range of sideband frequencies within a tuning range 202 of the oscillator for the pair of conventional PFD-based PLLs of FIG. 4, the conventional reference-locked signal source of FIG. 5 and the dual-output signal source of FIG. 6 in accordance with the present invention.

The conventional PFD-based PLL of FIG. 4 has the significant advantage of a maximum possible capture range 204 (i.e. the capture range spans the oscillator tuning range 202) and a narrow loop bandwidth 206 leading to a large range 208 of "useful" sidebands for the purposes being discussed. However, this topology suffers from PFD zero error and divider noise, which limits the phase error reduction at low frequencies as indicated by the upward kick in phase error 210.

The conventional reference-locked signal source of FIG. 5, suffers from the fact that for anywhere near the same capture range 220, the loop bandwidth 222 must be much wider, severely limiting the useful range 224 of sideband frequencies although providing significant reduction in phase error 226. Note that for the prior art case discussed above, where the loop bandwidth is selectively switched after capture, the useful range of sidebands can be increased but only at the cost of less reduction in phase error and higher susceptibly to loss of lock due to external disturbances.

The dual-output signal source of FIG. 6 in accordance with the invention maintains the advantage of the PFD: a maximum capture range 230 and narrow bandwidth 232 that provides a large range 234 of "useful" sidebands, while overcoming the limitation of phase error reduction as shown by phase error 236. The first loop bandwidth BW1 (narrow bandwidth 232) can be optimized for overall phase-noise performance (large range 234 of 'useful' sidebands) of the output signal while retaining the excellent capture and hold characteristics of that loop's topology (e.g. maximum capture range 230). The second loop having a narrow loop bandwidth 236 provides superior carrier-frequency phase alignment between the output signal and second signal (e.g. phase error 238). The output and second signal may therefore be configured as inputs to systems that require highly coherent carrier signals with de-correlated phase-noise such as phase-noise measurement systems or phase-noise cancellation systems.

Figure 10:
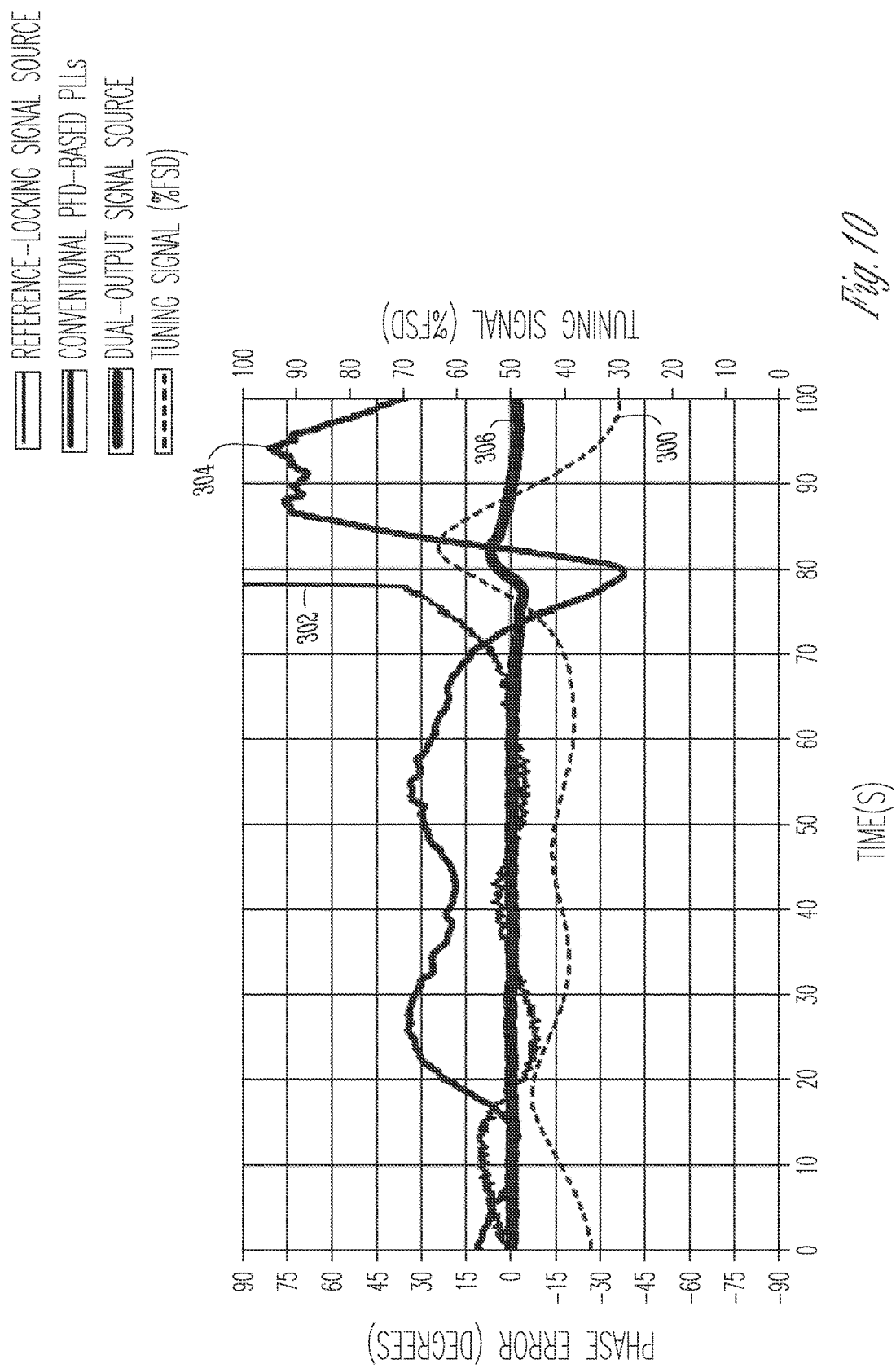
FIG. 10 is a diagram showing example phase errors for the dual PLLs of FIG. 4, the reference-locked signal source of FIG. 5 and the dual-output signal source of FIG. 6.

FIG. 10 shows representative data for the three signal sources considered in FIG. 9, with approximately equal bandwidths in each case. A dashed line 300 is the tuning signal that the PLL applies to the oscillator. The solid lines are the phase error between Signal 1 and Signal 2. Again, a lightweight line 302 corresponds to the reference-locked signal source of FIG. 5, a medium weight line 304 corresponds to the PFD-based PLL of FIG. 4 and a heavy weight line 306 corresponds to the dual-output signal source of FIG. 6 as representative of the invention.

As shown in FIG. 10, at around 75 seconds the effect of an external disturbance on the oscillator is seen in the excursion of the tuning signal 300. At about 78 seconds the reference-locked signal source of FIG. 5 is unable to correct for this disturbance and loses lock as shown by lightweight line 302 rising rapidly to 90° phase error, its trace being terminated at that point for clarity.

The PFD-based PLL of FIG. 4 maintains lock as observed at the PFD, but the phase error when multiplied to the Signal 2 frequency (N=1024 in this case) is large enough that it would cause problems in both phase-noise measurement and coherent carrier addition systems as shown by phase errors approaching 90° for medium weight line 304.

The dual-output signal source of FIG. 6 manages to maintain a phase error at the output of less than 10° throughout as shown in heavy weight line 306, more than satisfactory for operation of such systems.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A dual-loop phase-locking circuit, comprising:
   a first input configured to receive a first reference signal at a first reference frequency fref1 having a first reference phase;

a second input configured to receive a second reference signal at a second reference frequency fref2 that is locked to a multiple N of the reference signal where N is an integer greater than 100 and having a second reference phase;

a phase-locked loop (PLL) coupled to said first input, said PLL including a first phase detector, a divide-by-N circuit, a first integrating filter and an oscillator connected to provide a first loop with a first loop bandwidth BW1 to generate an output signal having an output frequency f independently locked to the same multiple N of the reference signal and having an output phase; and a second loop coupled to the second input, said second loop including a second phase detector configured to compare the output phase to the second reference phase to generate a phase error signal and a second integrating filter configured to integrate the phase error signal to produce an offset signal that is added to an input of the first integrating filter in the first loop to reduce fluctuations in the phase error signal having frequencies less than a second loop bandwidth BW2<BW1.

2. The dual-loop phase-locking circuit of claim 1, wherein BW2<1/10*BW1.

3. The dual-loop phase-locking circuit of claim 1, wherein the first phase detector supports a capture range of the PLL that is independent of the first loop bandwidths BW1.

4. The dual-loop phase-locking circuit of claim 3, wherein the capture range spans a tuning range of the oscillator, wherein the first loop bandwidth BW1<1/10* tuning range of the oscillator.

5. The dual-loop phase-locking circuit of claim 4, wherein the second loop bandwidth BW2<1/10*BW1.

6. The dual-loop phase-locking circuit of claim 1, wherein the second integrating filter is implemented digitally and comprises:
an A/D converter that sample the phase error signal;
a digital filter configured to integrate the sampled phase error signal;
a D/A converter that converts the integrated phase error signal to an analog signal to generate the offset signal.

7. The dual-loop phase-locking circuit of claim 1, wherein to prevent saturation of the second integrating filter during a capture, the second integrating filter is configured to hold its output at zero until the first loop achieves a phase-locked state.

8. The dual-loop phase-locking circuit of claim 7, wherein the phase-locked state is achieved when an output of the first phase detector lies within a phase window.

9. The dual-loop phase-locking circuit of claim 1, wherein the second reference frequency is equal to N*fref1/M where M is an integer <N, further comprising:
a divide-by-M circuit coupled to the output of the oscillator to scale the output frequency to N*fref1/M,
wherein the second phase detector compares the output phase at the output of the divide-by-M circuit to the second reference phase to generate the phase error signal.

10. The dual-loop phase-locking circuit of claim 1, wherein the second loop is configured to add a set-point to the phase error signal at the input to the second integrating filter to specify a phase offset between the output signal and the second reference signal.

11. The dual-loop phase-locking circuit of claim 10, wherein the second phase detector comprises an I/Q mixer that generates I and Q outputs that are 90 degrees out of phase and together uniquely identify any phase angle between 0 and 360 degrees, further comprising:
a first switch responsive to select the I or Q output corresponding to the set-point; and
wherein the second integrating filter is responsive to the selected I or Q output to switch a sign applied within the second integrating filter.

12. A dual-loop phase-locking circuit, comprising:
a first input configured to receive a first reference signal at a first reference frequency fref1 having a first reference phase;
a second input configured to receive a second reference signal at a second reference frequency fref2 that is locked to a multiple N of the reference signal where N is an integer greater than 100 and having a second reference phase;
a first phase-locked loop (PLL) coupled to the first input, said first loop including an oscillator configured to generate an output signal having an output frequency f independently locked to the same multiple N of the reference signal and an oscillator output phase, a divide-by-N circuit coupled to the output signal, a first phase detector configured to compare the first reference phase to an output phase of the divide-by-N circuit to generate a first phase error signal and a first integrating filter configured to integrate the first phase error signal to produce a tuning signal, said tuning signal coupled to a tuning port of the oscillator to drive the output frequency f to N×fref1 and to reduce fluctuations of the first phase error signal having frequencies less than a first loop bandwidth BW1; and
a second loop including a second phase detector configured to compare the oscillator output phase to the second reference phase to generate a second phase error signal and a second integrating filter configured to integrate the second phase error signal to produce an offset signal that is input to and integrated by the first integrating filter in the first loop to reduce fluctuations in the second phase error signal having frequencies less than a second loop bandwidth BW2<BW1.

13. A dual-output signal source, comprising:
an input configured to receive a reference signal at a reference frequency fref having a reference phase;
a circuit coupled to said input, said circuit configured to generate a first output signal having a first output frequency f1 locked to a multiple N/M of the reference frequency where N and M are integers, N>100, N>M and N/M is an integer and having a first output phase;
a PLL including
a first loop coupled to said input to receive the reference signal, said first loop including a first phase detector, a divide-by-N circuit, a first integrating filter and an oscillator connected to provide the first loop with a first loop bandwidth BW1 and to generate an intermediate signal having an intermediate frequency fn independently locked to a multiple N of the reference signal;
a divide-by-M circuit at the output of the oscillator configured to reduce the intermediate frequency fn to a second output frequency f driven to equal N×fref/M and having a second output phase; and
a second loop including a second phase detector configured to compare the first output phase to the second output phase to generate a phase error signal and a second integrating filter configured to integrate the phase error signal to produce an offset signal that is added to an input of the first integrating filter in the first loop to reduce fluctuations in the phase error signal having frequencies less than a second loop bandwidth BW2<1/10*BW1, wherein the first and second output signals have a common frequency N×fref/M controlled by the reference signal and are phase-locked to each other.

14. The dual-output signal source of claim 13, wherein the first phase detector supports a capture range of the PLL that is independent of the first loop bandwidths.

15. The dual-output signal source of claim 14, wherein the capture range spans a tuning range of the oscillator, wherein the first loop bandwidth BW1<1/10* tuning range of the oscillator.

16. The dual-output signal source of claim 13, wherein the second integrating filter is implemented digitally and comprises:
an A/D converter that sample the phase error signal;
a digital filter configured to integrate the sampled phase error signal;
a D/A converter that converts the integrated phase error signal to an analog signal; and
a current source responsive to the analog signal to generate the offset signal.

17. The dual-output signal source of claim 13, wherein to prevent saturation of the second integrating filter during a capture, the second integrating filter is configured to hold its output at zero until the first loop achieves a phase-locked state.

18. The dual-output signal source of claim 17, wherein the phase-locked state is achieved when an output of the first phase detector lies within a phase window.

19. The dual-output signal source of claim 13, wherein the second loop is configured to add a set-point to the phase error signal at the input to the second integrating filter to specify a phase offset between the output signal and the second reference signal.

20. The dual-output signal source of claim 19, wherein the second phase detector comprises an I/Q mixer that generates I and Q outputs that are 90 degrees out of phase and together uniquely identify any phase angle between 0 and 360 degrees, further comprising:
a first switch responsive to select the I or Q output corresponding to the set-point; and
wherein the second integrating filter is responsive to the selected I or Q output to switch a sign applied within the second integrating filter.

* * * * *

UNITED STATES PATENT AND TRADEMARK OFFICE
CERTIFICATE OF CORRECTION

PATENT NO. : 11,588,488 B1
APPLICATION NO. : 17/546662
DATED : February 21, 2023
INVENTOR(S) : Gary Ian Moore It is certified that error appears in the above-identified patent and that said Letters Patent is hereby corrected as shown below:

In the Specification

In Column 6, Line 65, delete "BW 1" and insert --BW1-- therefor

In Column 8, Line 24, delete "3600" and insert --360°-- therefor

In Column 8, Line 25, delete "10" and insert --1°-- therefor

In Column 8, Line 29, delete "1 and 2 102 and 104" and insert --1 102 and 2 104-- therefor In Column 8, Line 34, delete "136" and insert --116-- therefor In Column 8, Line 50, delete "118" and insert --116-- therefor In Column 9, Line 6, delete "2700" and insert --270°-- therefor In Column 9, Line 8, delete "loop," and insert --loop;-- therefor In the Claims In Column 12, Line 49, in Claim 13, delete "including" and insert --including:-- therefor Signed and Sealed this
Twenty-eighth Day of May, 2024

Katherine Kelly Vidal
*Director of the United States Patent and Trademark Office*